(12) United States Patent
Kim

(10) Patent No.: US 9,425,437 B2
(45) Date of Patent: Aug. 23, 2016

(54) METHOD OF MANUFACTURING ORGANIC LIGHT-EMITTING DIODE (OLED) DISPLAY

(71) Applicant: Samsung Display Co., Ltd., Yongin, Gyeonggi-Do (KR)

(72) Inventor: Min-Chang Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/547,014

(22) Filed: Nov. 18, 2014

(65) Prior Publication Data

US 2016/0141557 A1 May 19, 2016

(51) Int. Cl.
*H01L 51/56* (2006.01)
*H01L 51/52* (2006.01)

(52) U.S. Cl.
CPC ............ *H01L 51/56* (2013.01); *H01L 51/5237* (2013.01)

(58) Field of Classification Search
CPC ............................... H01L 51/52; H01L 51/56
See application file for complete search history.

(56) References Cited

U.S. PATENT DOCUMENTS

| | | | |
|---|---|---|---|
| 2001/0048234 A1* | 12/2001 | Liu | H01L 51/5237 297/3 |
| 2006/0082298 A1* | 4/2006 | Becken et al. | 313/512 |
| 2007/0170605 A1* | 7/2007 | Lee et al. | 264/1.1 |
| 2007/0173167 A1* | 7/2007 | Choi | H01L 51/5246 445/25 |
| 2011/0267566 A1 | 11/2011 | Shiau | |
| 2011/0315313 A1* | 12/2011 | Ishiwata et al. | 156/272.2 |
| 2012/0048462 A1 | 3/2012 | Lee | |
| 2012/0055553 A1* | 3/2012 | Logunov et al. | 136/263 |
| 2013/0137200 A1* | 5/2013 | Shimomura | H01L 33/0095 438/26 |
| 2013/0300284 A1* | 11/2013 | Nishido | H01L 51/0097 313/511 |
| 2014/0361273 A1* | 12/2014 | Nozawa | H01L 51/524 257/40 |

FOREIGN PATENT DOCUMENTS

| | | |
|---|---|---|
| JP | 2000-075300 A | 3/2000 |
| KR | 10-2007-0078501 A | 8/2007 |
| KR | 10-0759098 B1 | 9/2007 |
| KR | 10-2012-0020942 A | 3/2012 |

* cited by examiner

*Primary Examiner* — Donald Raleigh
(74) *Attorney, Agent, or Firm* — Knobbe, Martens, Olson & Bear, LLP

(57) ABSTRACT

A method of manufacturing an organic light-emitting diode (OLED) display is disclosed. In one aspect, the method includes forming an OLED over a first substrate and forming a sealing member over the first substrate or a second substrate opposite to the first substrate, to at least partially surround the OLED, wherein a plurality of holes are defined in a first region of the sealing member. The method further includes aligning the first and second substrates with the sealing member interposed therebetween and irradiating a laser beam along a path of the sealing member.

21 Claims, 4 Drawing Sheets

METHOD OF MANUFACTURING ORGANIC LIGHT-EMITTING DIODE (OLED) DISPLAY

BACKGROUND

1. Field

The described technology generally relates to methods of manufacturing an organic light-emitting diode (OLED) display.

2. Description of the Related Technology

Recently, display apparatuses have been replaced with portable thin flat panel displays. Among the flat panel displays, a field effect light-emitting display is self-luminous and attracts attention as the next-generation display because it has favorable characteristics such as a wide viewing angle, a high contrast, and a high response rate. Also, in comparison with an inorganic light-emitting display, an OLED display including an organic emission layer has excellent luminance, driving voltage, and response rate characteristics and provides a multicolor.

In general, an OLED display has a structure in which at least one organic layer including an emission layer is interposed between a pair of electrodes.

SUMMARY OF CERTAIN INVENTIVE ASPECTS

One inventive aspect is a method of manufacturing an OLED display that is substantially uniformly sealed.

Another aspect is a method of manufacturing an OLED display which includes: forming an organic light-emitting unit on a first substrate; forming a sealing member including a plurality of holes in a first region, on the first substrate or a second substrate opposite to the first substrate, to surround the organic light-emitting unit; aligning the first substrate and the second substrate with the sealing member interposed therebetween; and irradiating a laser beam along a path of the sealing member.

The sealing member may include frit.

The first region may be a region onto which the laser beam is repeatedly irradiated at the start and end of the irradiation of the laser beam.

The laser beam may be irradiated at a substantially uniform intensity along the path of the sealing member.

The laser beam may be irradiated while being moved at a substantially uniform speed along the path of the sealing member.

The sealing member may further include a second region including a plurality of holes.

The method may further include attaching a circuit substrate to a region adjacent to the second region.

At least one of the first substrate and the second substrate may transmit the laser beam.

Another aspect is a method of manufacturing an OLED display which includes: forming an organic light-emitting unit on a first substrate; forming a sealing member including a first region narrower than other regions, on the first substrate or a second substrate opposite to the first substrate, to surround the organic light-emitting unit; aligning the first substrate and the second substrate with the sealing member interposed therebetween; and irradiating a laser beam along a path of the sealing member.

The sealing member may include frit.

The first region may be a region onto which the laser beam is repeatedly irradiated at the start and end of the irradiation of the laser beam.

The laser beam may be irradiated at a substantially uniform intensity along the path of the sealing member.

The laser beam may be irradiated while being moved at a substantially uniform speed along the path of the sealing member.

The sealing member may further include a second region narrower than other regions. The method may further include attaching a circuit substrate to a region adjacent to the second region.

Another aspect is a method of manufacturing an organic light-emitting diode (OLED) display, the method comprising: forming an OLED over a first substrate; forming a sealing member over the first substrate or a second substrate opposite to the first substrate, to at least partially surround the OLED, wherein a plurality of holes are defined in a first region of the sealing member; aligning the first and second substrates with the sealing member interposed therebetween; and irradiating a laser beam along a path of the sealing member.

In the above method, the sealing member comprises fit. In the above method, the first region is a region onto which the laser beam is repeatedly irradiated at the start and end of the irradiation of the laser beam. In the above method, the laser beam is irradiated at a substantially uniform intensity along the path of the sealing member. In the above method, the laser beam is irradiated while being moved at a substantially uniform speed along the path of the sealing member. In the above method, the sealing member further comprises a second region comprising a plurality of holes.

The above method further comprises attaching a circuit substrate to a region adjacent to the second, region. In the above method, at least one of the first and second substrates transmits the laser beam. In the above method, a cross-section of at least one of the holes has a substantially square shape. In the above method, the holes have substantially the same shape. In the above method, the holes are substantially evenly spaced part. In the above method, at least one of the holes has a slit shape. In the above method, the laser beam moves in a direction, and wherein the slit shape hole extends in a direction substantially identical to the movement direction of the laser beam.

Another aspect is a method of manufacturing an organic light-emitting diode (OLED) display, the method comprising: forming an OLED over a first substrate; forming a sealing member over the first substrate or a second substrate opposite to the first substrate, to at least partially surround the OLED, wherein the sealing member comprises a first region narrower than other regions of the sealing member; substantially aligning the first and second substrates with the sealing member interposed therebetween; and irradiating a laser beam along a path of the sealing member.

In the above method, the sealing member comprises frit. In the above method, the first region is a region onto which the laser beam is repeatedly irradiated at the start and end of the irradiation of the laser beam. In the above method, the laser beam is irradiated at a substantially uniform intensity along the path of the sealing member. In the above method, the laser beam is irradiated while being moved at a substantially uniform speed along the path of the sealing member. In the above method, the sealing member further comprises a second region narrower than other regions. The above method further comprises attaching a circuit substrate to a region adjacent to the second region.

DETAILED DESCRIPTION OF CERTAIN INVENTIVE EMBODIMENTS

Figure 1:
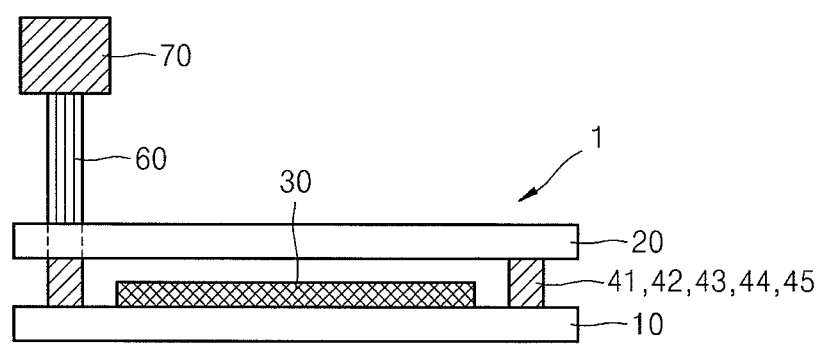
FIG. 1 is a cross-sectional view schematically illustrating a method of manufacturing an OLED display according to an embodiment.

In OLED displays, when moisture or oxygen flows from a surrounding environment into an OLED, the lifetime of the OLED is shortened due to the oxidation or lamination of an electrode material, a light emission efficiency is degraded, and the color of emitted light is changed.

Thus, in the process of manufacturing the OLED display, a sealing process is typically performed to prevent intrusion of moisture by isolating the OLED from the external environment. According to the typical sealing process, an inorganic thin film and organic polymer such as polyester (PET) are laminated on an upper electrode of the OLED display. Alternatively, a moisture absorbent is formed in an encapsulation substrate, the inside of the encapsulation substrate is filled with nitrogen gas, and then the edge of the encapsulation substrate is sealed with a sealant such as epoxy.

However, the above methods may not prevent the intrusion of destructive factors such as moisture or oxygen by 100%. Therefore, the methods are unfavorable for the OLED display that is vulnerable to moisture, and processes to embody the methods are complicated. To address the above problems, a substrate sealing method to improve the close adhesion between an OLED substrate and the encapsulation substrate by using fit as a sealant has been developed.

Thus, since OLED displays are sealed by depositing the frit on a glass substrate, the OLED substrate and the encapsulation substrate are completely sealed so that the OLED display may be more effectively protected.

In a method of sealing a substrate by using frit, frit is deposited on a sealing portion of each OLED display and then a laser beam irradiator moves and irradiates a laser beam onto the sealing portion of the OLED display, thereby hardening the frit to seal the substrate.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the following description, like reference numerals denote like elements, and redundant descriptions thereof will be omitted.

It will be understood that although the terms "first", "second", etc. may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprise", "include" and "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of description. In other words, since sizes and thicknesses of components in the drawings are arbitrarily illustrated for convenience of description, the following embodiments are not limited thereto.

In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 2:
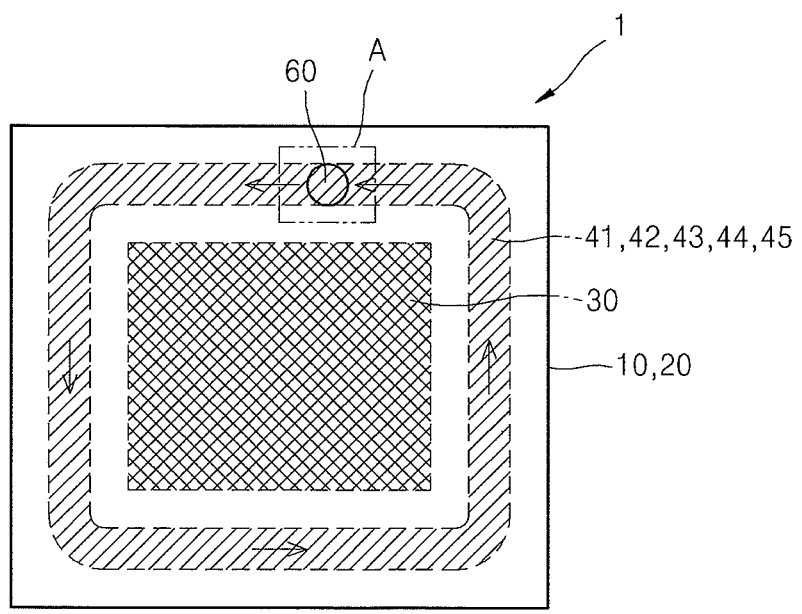
FIG. 2 is a top view of FIG. 1.
Figure 3:
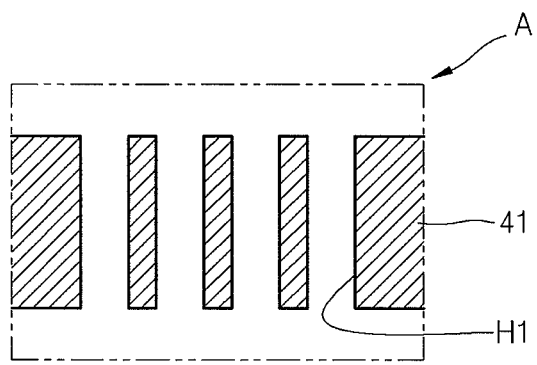
FIG. 3 is an enlarged view illustrating an embodiment of a region A of FIG. 2.

FIG. 1 is a cross-sectional view schematically illustrating a method of manufacturing an OLED display 1 according to an embodiment of the present invention, FIG. 2 is a top view of FIG. 1, and FIG. 3 is an enlarged view illustrating an embodiment of a region A of FIG. 2.

Referring to FIGS. 1, 2, and 3, the method of manufacturing the OLED display 1 according to an embodiment includes forming an organic light-emitting unit 30 on a first substrate 10 and forming a sealing member 41 including a plurality of holes H1 in a first region A, on the first substrate 10 or a second substrate 20 opposite to the first substrate 10, to surround the organic light-emitting unit 30. The method also includes aligning the first substrate 10 and the second substrate 20 with the sealing member 41 interposed therebetween and irradiating a laser beam 60 along a path of the sealing member 41.

The first substrate 10 may be a glass substrate. The second substrate 20 may be an encapsulation substrate that encapsulates the organic light-emitting unit 30 formed on the first substrate 10 and may be formed of a material (e.g., glass) that may transmit a laser beam.

The organic light-emitting unit 30 may include a plurality of OLEDs each including a hole injection electrode (not illustrated), an electron injection electrode (not illustrated), and an organic emission layer (not illustrated) disposed therebetween. Excitons are generated when holes injected from the hole injection electrode and electrons injected from the electron injection electrode are combined in the organic emission layer, and light is generated when the excitons drop from an excited state to a ground state.

The sealing member 41 may be formed on the second substrate 20 to surround the organic light-emitting unit 30 formed on the first substrate 10. The sealing member 41 is to prevent the organic light-emitting unit 30 from contacting external moisture or oxygen. The sealing member 41 may include the holes H1 in the first region A before the irradiation of the laser beam 60, but may form a closed loop after being hardened by the irradiation of the laser beam 60.

Although FIG. 2 illustrates that each edge portion of the sealing member 41 is curved at a predetermined curvature, disclosed embodiments are not limited thereto. For example, each edge portion of the sealing member 41 may have a right angle without curvature.

According to an embodiment, frit is used as the sealing member 41 to improve the close adhesion between the first substrate 10 and the second substrate 20 to effectively protect the organic light-emitting unit 30. The frit may be formed in various methods such as screen printing and pen dispensing. A mask (not illustrated) including a plurality of block regions may be used to form the holes in the first region A of the fit.

In an embodiment, the sealing member 41 is formed on the second substrate 20, the organic light-emitting unit 30 is formed on the first substrate 10, and then the first substrate 10 and the second substrate 20 are aligned together. However, disclosed embodiments are not limited thereto. That is, in another embodiment, the organic light-emitting unit 30 is formed on the first substrate 10, the sealing member 41 is formed on the first substrate 10 to surround the organic light-emitting unit 30, and then the first substrate 10 and the second substrate 20 are aligned together.

The laser beam 60 irradiated by a laser beam irradiator 70 may harden the sealing member 41 while moving along the path of the sealing member 41 disposed between the first substrate 10 and the second substrate 20. The laser beam 60 may have a beam profile of various shapes, for example, a flat top shape, a Gaussian shape, and a biconcave shape.

The sealing member 41 may include the holes H1 in the first region A. Referring to FIG. 3, the sealing member 41 according to an embodiment includes, in the first region A, a plurality of slit-type holes H1 that extend in a direction crossing (e.g., substantially perpendicular to) the movement direction of the laser beam 60.

The first region A may be a region onto which the laser beam 60 is repeatedly irradiated at the start and end of the irradiation of the laser beam 60. That is, the laser beam 60 may harden the sealing member 41 while moving in an arrow direction along the path of the sealing member 41 after the start of the irradiation of the laser beam 60 onto the first region A, and the irradiation of the laser beam 60 may be ended when the laser beam 60 moves along a closed loop and reaches the first region A again.

That is, the irradiation time of the laser beam 60 onto the first region A may be longer than the irradiation time of the laser beam 60 onto other regions. When the width and/or thickness of the sealing member 41 before the irradiation of the laser beam 60 are/is equal in all regions, the width and/or thickness of the first region A included in the sealing member 41 after the irradiation of the laser beam 60 may be greater than the width and/or thickness of other regions.

However, since the sealing member 41 according to an embodiment includes the first region A including the slit-type holes H1, the uniformity of the width and/or thickness of the sealing member 41 after the irradiation of the laser beam 60 may be improved.

In this case, the laser beam 60 may have a substantially uniform intensity along the path of the sealing member 41 and may move at a substantially uniform speed. That is, the method of manufacturing the OLED display 1 according to an embodiment can substantially uniformly seal the OLED display 1 without changing the intensity and speed of the laser beam 60 and may improve productivity.

Figure 4:
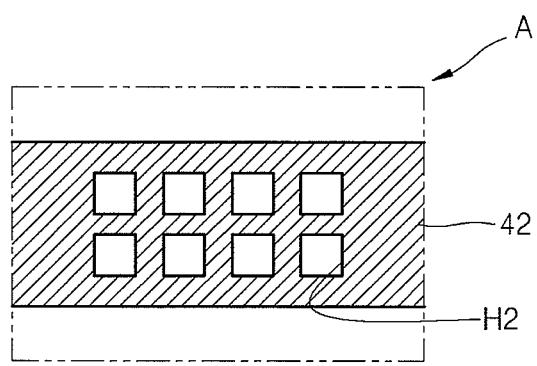
FIGS. 4 and 5 are enlarged views illustrating other embodiments of the region A of FIG. 2.
Figure 5:
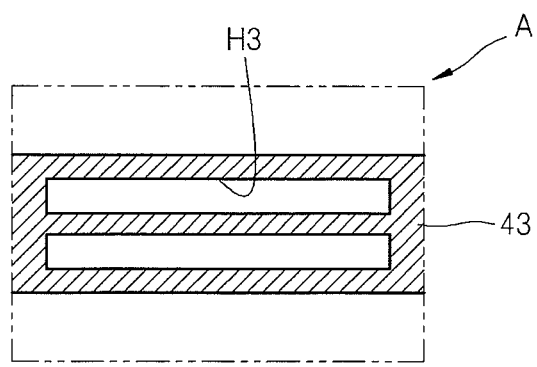

FIGS. 4 and 5 are enlarged views illustrating other embodiments of the region A of FIG. 2.

Referring to FIG. 4, a sealing member 42 according to an embodiment may include, in the first region A, a plurality of holes H2 that are disposed in a matrix pattern.

Referring to FIG. 5, a sealing member 43 according to an embodiment may include, in a first region A, a plurality of slit-type holes H3 that extend in a direction substantially identical to the movement direction of the laser beam 60.

Since the sealing member 42/43 includes the first region A including the holes H2/H3, the uniformity of the width and/or thickness of the sealing member 42/43 after the irradiation of the laser beam 60 may be improved.

In this case, the laser beam 60 may have a substantially uniform intensity along the path of the sealing member 42/43 and may move at a substantially uniform speed. That is, the method of manufacturing the OLED display 1 according to an embodiment may uniformly seal the OLED display 1 without changing the intensity and speed of the laser beam 60 and may improve productivity.

Figure 6:
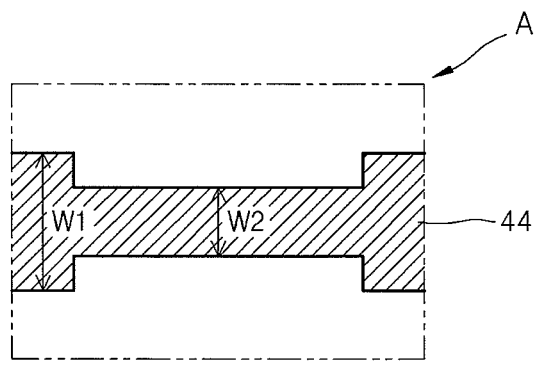
FIGS. 6 and 7 are enlarged views illustrating other embodiments of the region A of FIG. 2.
Figure 7:
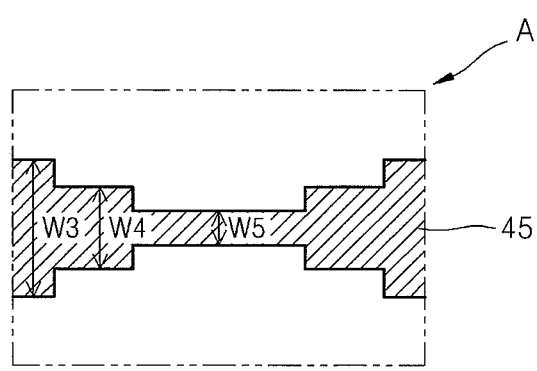

FIGS. 6 and 7 are enlarged views illustrating other embodiments of the region A of FIG. 2.

Referring to FIGS. 1, 2, and 6, the method of manufacturing the OLED display 1 according to an embodiment includes forming an organic light-emitting unit 30 on a first substrate 10 and forming a sealing member 44 including a first region A narrower than other regions, on the first substrate 10 or a second substrate 20 opposite to the first substrate 10, to surround the organic light-emitting unit 30. The method also includes aligning the first substrate 10 and the second substrate 20 with the sealing member 44 interposed therebetween; and irradiating a laser beam 60 along a path of the sealing member 44.

The sealing member 44 may be formed on the second substrate 20 to surround the organic light-emitting unit 30 formed on the first substrate 10. The sealing member 44 is to prevent the organic light-emitting unit 30 from contacting external moisture or oxygen, and may form a closed loop.

According to an embodiment, fit is used as the sealing member 44 to improve the close adhesion between the first substrate 10 and the second substrate 20 to effectively protect the organic light-emitting unit 30. The frit may be formed in various methods such as screen printing and pen dispensing.

In an embodiment, the sealing member 44 is formed on the second substrate 20, the organic light-emitting unit 30 is formed on the first substrate 10, and then the first and second substrates 10 and 20 are substantially aligned together. However, disclosed embodiments are not limited thereto. That is, in another embodiment, the organic light-emitting unit 30 is formed on the first substrate 10, the sealing member 44 is formed on the first substrate 10 to surround the organic light-emitting unit 30, and then the first substrate 10 and the second substrate 20 are aligned together.

The laser beam 60 irradiated by the laser beam irradiator 70 may harden the sealing member 44 while moving along the path of the sealing member 44 disposed between the first and second substrates 10 and 20. The laser beam 60 may have a beam profile of various shapes, for example, a flat top shape, a Gaussian shape, and a biconcave shape.

The width W2 of the first region A included in the sealing member 44 may be less than the width W1 of the remaining region of the sealing member 44.

The first region A may be a region onto which the laser beam 60 is repeatedly irradiated at the start and end of the irradiation of the laser beam 60. That is, the laser beam 60 may harden the sealing member 44 while moving in an arrow direction along the path of the sealing member 44 after the start of the irradiation of the laser beam 60 onto the first region A. The irradiation of the laser beam 60 may be ended when the laser beam 60 moves along a closed loop and reaches the first region A again.

For example, the irradiation time of the laser beam 60 onto the first region A may be longer than the irradiation time of the laser beam 60 onto other regions. When the width and/or thickness of the sealing member 44 before the irradiation of the laser beam 60 are/is equal in all regions, the width and/or thickness of the first region A included in the sealing member 44 after the irradiation of the laser beam 60 may be greater than the width and/or thickness of other regions.

However, since the sealing member 44 according to an embodiment includes the first region A narrower than other regions, the uniformity of the width and/or thickness of the sealing member 44 after the irradiation of the laser beam 60 may be improved.

In this case, the laser beam 60 may have a substantially uniform intensity along the path of the sealing member 44 and may move at a substantially uniform speed. That is, the method of manufacturing the OLED display 1 according to an embodiment may uniformly seal the OLED display 1 without changing the intensity and speed of the laser beam 60 and may improve productivity.

Referring to FIG. 7, the widths W4 and W5 of the first region A included in a sealing member 45 may be less than the width W3 of the remaining region of the sealing member 45, and the width W4 of the sealing member 45 corresponding to an edge portion of the first region A may be greater than the width W5 of the sealing member 45 corresponding to a center portion of the first region A.

Since the width of the sealing member 45 decreases toward the center portion of the first region A, the OLED display 1 may be sealed more uniformly.

Figure 8:
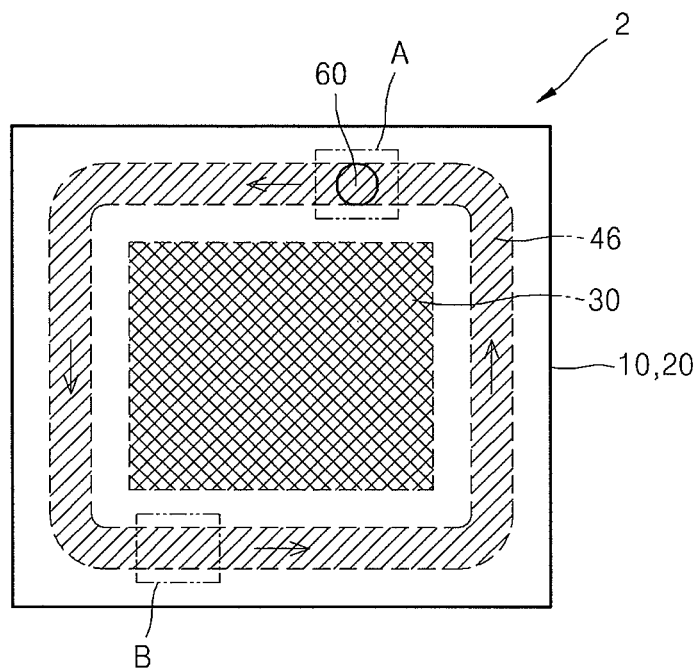
FIGS. 8 and 9 are plan views schematically illustrating a method of manufacturing an OLED display according to another embodiment.
Figure 9:
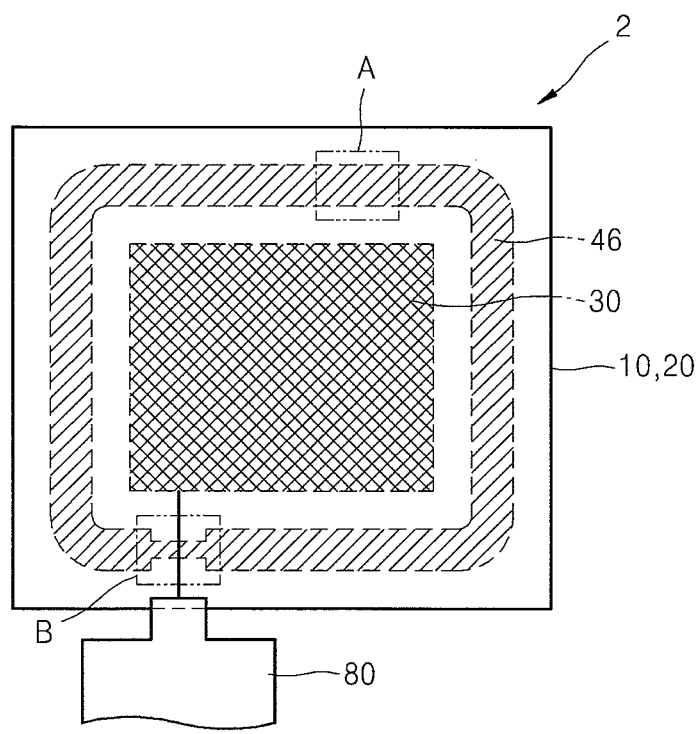

FIGS. 8 and 9 are plan views schematically illustrating a method of manufacturing an OLED display 2 according to another embodiment. Hereinafter, like reference numerals denote like elements as in FIGS. 1 to 7, and redundant descriptions thereof will be omitted.

Referring to FIGS. 8 and 9, the method of manufacturing the OLED display 2 according to another embodiment includes forming an organic light-emitting unit 30 on a first substrate 10 and forming a sealing member 46 including a first region A and a second region B that include a plurality of holes or are narrower than other regions, on the first substrate 10 or a second substrate 20 opposite to the first substrate 10, to surround the organic light-emitting unit 30. The method also includes aligning the first substrate 10 and the second substrate 20 with the sealing member 46 interposed therebetween and irradiating a laser beam 60 along a path of the sealing member 46.

The laser beam 60 irradiated by the laser beam irradiator 70 may harden the sealing member 46 while moving along the path of the sealing member 46 disposed between the first substrate 10 and the second substrate 20. The first region A and the second region B included in the sealing member 46 may include a plurality of holes H1, H2, and H3 as illustrated in FIGS. 3 to 5, or may be narrower than other regions as illustrated in FIGS. 6 and 7.

The first region A may be a region onto which the laser beam 60 is repeatedly irradiated at the start and end of the irradiation of the laser beam 60. That is, the laser beam 60 may harden the sealing member 46 while moving in an arrow direction along the path of the sealing member 46 after the start of the irradiation of the laser beam 60 onto the first region A, and the irradiation of the laser beam 60 may be ended when the laser beam 60 moves along a closed loop and reaches the first region A again.

That is, the irradiation time of the laser beam 60 onto the first region A may be longer than the irradiation time of the laser beam 60 onto other regions. When the width and/or thickness of the sealing member 46 before the irradiation of the laser beam 60 are/is equal in all regions, the width and/or thickness of the first region A included in the sealing member 46 after the irradiation of the laser beam 60 may be greater than the width and/or thickness of other regions.

However, since the sealing member 46 according to an embodiment includes the first region A that includes a plurality of holes H1, H2, and H3 or is narrower than other regions, the uniformity of the width and/or thickness of the sealing member 46 after the irradiation of the laser beam 60 may be improved.

In this case, the laser beam 60 may have a substantially uniform intensity along the path of the sealing member 46 and may move at a substantially uniform speed. That is, the method of manufacturing the OLED display 2 according to an embodiment may substantially uniformly seal the OLED display 2 without changing the intensity and speed of the laser beam 60 and may improve productivity.

Since the second region B is not a region onto which the laser beam 60 is repeatedly irradiated, the width and/or thickness of the second region B included in the sealing member 46 after the irradiation of the laser beam 60 may be less than the width and/or thickness of other regions.

According to an embodiment, the method may further include attaching a circuit substrate 80 to a region adjacent to the second region B. The second region B may be a region through which lines extending from the organic light-emitting unit 30 pass together. Since the width and/or thickness of the second region B of the sealing member 46 are/is formed to be smaller than the width and/or thickness of other regions, the circuit substrate 80 may be easily attached.

As described above, according to at least one of the disclosed embodiments, OLED displays can be substantially uniformly sealed, and the width and/or thickness of the sealing member corresponding to a predetermined region may be formed to be small.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. A method of manufacturing an organic light-emitting diode (OLED) display, the method comprising:
    forming an OLED over a first substrate;
    forming a sealing member over the first substrate or a second substrate opposite to the first substrate, to at least partially surround the OLED, wherein a plurality of holes are defined in a first region of the sealing member, and wherein at least one of the holes has a slit shape;
    aligning the first and second substrates with the sealing member interposed therebetween; and
    irradiating a laser beam along a path of the sealing member, wherein a longitudinal direction of the slit shape hole is substantially identical to a movement direction of the laser beam.

2. The method of claim 1, wherein the sealing member comprises frit.

3. The method of claim 1, wherein the first region is a region onto which the laser beam is repeatedly irradiated at the start and end of the irradiation of the laser beam.

4. The method of claim 1, wherein the laser beam is irradiated at a substantially uniform intensity along the path of the sealing member.

5. The method of claim 1, wherein the laser beam is irradiated while being moved at a substantially uniform speed along the path of the sealing member.

6. The method of claim 1, wherein the sealing member further comprises a second region comprising a plurality of holes.

7. The method of claim 6, further comprising attaching a circuit substrate to a region adjacent to the second region.

8. The method of claim 1, wherein at least one of the first and second substrates transmits the laser beam.

9. The method of claim 1, wherein a cross-section of at least one of the holes has a substantially square shape.

10. The method of claim 1, wherein the holes have substantially the same shape.

11. The method of claim 1, wherein the holes are substantially evenly spaced part.

12. The method of claim 1, wherein at least one of the holes has a slit shape.

13. The method of claim 12, wherein the laser beam moves in a direction, and wherein the slit shape hole extends in a direction substantially identical to the movement direction of the laser beam.

14. A method of manufacturing an organic light-emitting diode (OLED) display, the method comprising:
 forming an OLED over a first substrate;
 forming a sealing member over the first substrate or a second substrate opposite to the first substrate, to at least partially surround the OLED, wherein the sealing member comprises a first region narrower than other regions of the sealing member;
 substantially aligning the first and second substrates with the sealing member interposed therebetween; and
 irradiating a laser beam along a path of the sealing member,
 wherein the first region and the other regions are on the same plane over the first substrate or the second substrate,
 wherein a plurality of holes are defined in the first region of the sealing member, and wherein at least one of the holes has a slit shape, and wherein a longitudinal direction of the slit shape hole is substantially identical to a movement direction of the laser beam.

15. The method of claim 14, wherein the sealing member comprises frit.

16. The method of claim 14, wherein the first region is a region onto which the laser beam is repeatedly irradiated at the start and end of the irradiation of the laser beam.

17. The method of claim 14, wherein the laser beam is irradiated at a substantially uniform intensity along the path of the sealing member.

18. The method of claim 14, wherein the laser beam is irradiated while being moved at a substantially uniform speed along the path of the sealing member.

19. The method of claim 14, wherein the sealing member further comprises a second region narrower than other regions.

20. The method of claim 19, further comprising attaching a circuit substrate to a region adjacent to the second region.

21. The method of claim 1, wherein the first region includes i) a first body portion, ii) a second body portion extending from the first body portion and iii) edge portions extending from the second portion and formed on opposite sides of the second body portion, wherein the first body portion has a first width, wherein the second body portion has a second width greater than the first width, and wherein each of the edge portions has a third width which is greater than the first and second widths and the same as the remaining regions of the sealing member.

* * * * *